United States Patent
Majima et al.

(10) Patent No.: US 8,749,204 B2
(45) Date of Patent: Jun. 10, 2014

(54) BATTERY CONDITION DETECTOR, BATTERY PACK INCLUDING SAME, AND BATTERY CONDITION DETECTING METHOD

(75) Inventors: Yoshihide Majima, Tokyo (JP); Keiichi Kitamura, Tokyo (JP); Kazuhiko Takeno, Kanagawa (JP); Yasuyuki Kanai, Tokyo (JP); Haruo Uemura, Kumamoto (JP)

(73) Assignees: Mitsumi Electric Co., Ltd., Tokyo (JP); NTT DoCoMo, Inc., Tokyo (JP)

( * ) Notice: Subject to any disclaimer, the term of this patent is extended or adjusted under 35 U.S.C. 154(b) by 336 days.

(21) Appl. No.: 13/062,965
(22) PCT Filed: Sep. 9, 2009
(86) PCT No.: PCT/JP2009/065745
§ 371 (c)(1), (2), (4) Date: Mar. 31, 2011
(87) PCT Pub. No.: WO2010/029942
PCT Pub. Date: Mar. 18, 2010

(65) Prior Publication Data
US 2011/0187329 A1 Aug. 4, 2011

(30) Foreign Application Priority Data
Sep. 11, 2008 (JP) ................. 2008-233728

(51) Int. Cl.
*H02J 7/04* (2006.01)
*H01M 2/00* (2006.01)
*G01N 27/416* (2006.01)

(52) U.S. Cl.
USPC .............. 320/149; 429/61; 324/426; 324/430

(58) Field of Classification Search
USPC ............................................ 320/149; 429/61
See application file for complete search history.

(56) References Cited

U.S. PATENT DOCUMENTS

| | | | | |
|---|---|---|---|---|
| 4,385,336 A | * | 5/1983 | Takeshita et al. | 379/29.03 |
| 5,530,336 A | * | 6/1996 | Eguchi et al. | 320/118 |
| 6,212,410 B1 | | 4/2001 | Ishida | |
| 6,268,710 B1 | | 7/2001 | Koga | |

(Continued)

FOREIGN PATENT DOCUMENTS

| | | |
|---|---|---|
| JP | 64-047232 | 2/1989 |
| JP | 07-169510 | 7/1995 |

(Continued)

OTHER PUBLICATIONS

Japanese Office Action mailed Jan. 7, 2014.

*Primary Examiner* — M'Baye Diao
(74) *Attorney, Agent, or Firm* — IPUSA, PLLC (57) ABSTRACT

A battery condition detector configured to detect a micro short circuit of a rechargeable battery is disclosed. The battery condition detector includes a processing part configured to calculate the remaining capacity and the full-charge capacity of a rechargeable battery 200 and to determine the micro short circuit of the rechargeable battery 200 by detecting an overcharge of the rechargeable battery 200 based on a charged capacity charged during the charging of the rechargeable battery 200, the remaining capacity calculated at a calculation time immediately before the start of the charging, and the full-charge capacity calculated before the start of the charging; and a communications part 70 configured to output a signal according to the determination result of the processing part 50.

9 Claims, 7 Drawing Sheets

(56) References Cited

U.S. PATENT DOCUMENTS

| | | | |
|---|---|---|---|
| 6,563,318 B2* | 5/2003 | Kawakami et al. | 324/426 |
| 6,611,128 B2 | 8/2003 | Minamiura et al. | |
| 6,759,832 B2 | 7/2004 | Minamiura et al. | |
| 6,812,436 B2* | 11/2004 | Nomura et al. | 219/497 |
| 6,812,673 B2* | 11/2004 | Fujiwara | 320/136 |
| 7,135,839 B2* | 11/2006 | Iida et al. | 320/149 |
| 7,482,784 B2* | 1/2009 | Nagaoka | 320/132 |
| 7,541,777 B2* | 6/2009 | Nakano et al. | 320/134 |
| 7,626,394 B2* | 12/2009 | Kimura et al. | 324/427 |
| 8,334,699 B2* | 12/2012 | Asakura et al. | 324/426 |
| 2001/0005126 A1* | 6/2001 | Ichihara et al. | 320/149 |
| 2003/0052646 A1 | 3/2003 | Minamiura et al. | |
| 2003/0178970 A1 | 9/2003 | Minamiura et al. | |
| 2005/0040792 A1* | 2/2005 | Nair | 320/162 |
| 2006/0186859 A1 | 8/2006 | Fujikawa et al. | |
| 2007/0216425 A1* | 9/2007 | Okamura et al. | 324/678 |
| 2008/0036415 A1* | 2/2008 | Kaizuka et al. | 318/730 |
| 2008/0122399 A1* | 5/2008 | Nishino et al. | 320/103 |
| 2008/0172202 A1* | 7/2008 | Nakazato | 702/151 |

FOREIGN PATENT DOCUMENTS

| | | |
|---|---|---|
| JP | 09-084277 | 3/1997 |
| JP | 11-135156 | 5/1999 |
| JP | 2001-086656 | 3/2001 |
| JP | 3217007 | 8/2001 |
| JP | 2002-313435 | 10/2002 |
| JP | 2003-045500 | 2/2003 |
| JP | 2003-204627 | 7/2003 |
| JP | 2004-226393 | 8/2004 |
| JP | 2004-271342 | 9/2004 |
| JP | 2006-258797 | 9/2006 |
| JP | 2008-032683 | 2/2008 |
| WO | WO01/17053 | 3/2001 |

* cited by examiner

BATTERY CONDITION DETECTOR, BATTERY PACK INCLUDING SAME, AND BATTERY CONDITION DETECTING METHOD

TECHNICAL FIELD

The present invention relates to a battery condition detector configured to detect the condition of a rechargeable battery configured to feed electrical loads such as electronic apparatuses with electricity, a battery pack including the same, and a battery condition detecting method.

BACKGROUND ART

As an abnormal phenomenon of rechargeable batteries such as lithium ion batteries, a micro short circuit (micro short) phenomenon between the negative electrode and the positive electrode is known. Patent Document 1 discloses the details of the micro short circuit and a method of detecting the presence or absence of a micro short circuit. The method disclosed in Patent Document 1 determines the presence or absence of a short circuit in a battery including a positive electrode, a negative electrode, a separator disposed to separate the positive and negative terminals, and an electrolyte based on a measurement obtained by measuring an alternating current impedance between the positive and negative terminals with the electrolyte being in a solid state.

PRIOR-ART DOCUMENT

Patent Document

[Patent Document 1] Japanese Laid-Open Patent Application No. 2003-45500

SUMMARY OF THE INVENTION

Problems to be Solved by the Invention

However, according to the technique disclosed in Patent Document 1, it is necessary to convert the electrolyte into a solid state by cooling, so that the situation where it is possible to detect a micro short circuit of a rechargeable battery is limited.

Therefore, the present invention has an object of providing a battery condition detector, a battery pack including the same, and a battery condition detecting method that make it possible to detect a micro short circuit of a rechargeable battery irrespective of a situation surrounding the rechargeable battery.

Means for Solving the Problems

In order to achieve the above-described object, a battery condition detector according to the present invention includes a remaining capacity calculating part configured to calculate a remaining capacity of a rechargeable battery; a full-charge capacity calculating part configured to calculate a full-charge capacity of the rechargeable battery; a micro short circuit determining part configured to determine a micro short circuit of the rechargeable battery by detecting an overcharge of the rechargeable battery based on a charged capacity charged during charging of the rechargeable battery, the remaining capacity calculated at a calculation time immediately before a start of the charging by the remaining capacity calculating part, and the full-charge capacity calculated before the start of the charging by the full-charge capacity calculating part; and an output part configured to output a signal according to a determination result of the micro short circuit determining part.

Further, in order to achieve the above-described object, a battery condition detector according to the present invention includes an internal resistance calculating part configured to calculate an internal resistance of a rechargeable battery; a micro short circuit determining part configured to determine a micro short circuit of the rechargeable battery by detecting a decrease in the internal resistance calculated by the internal resistance calculating part from an initial value of the internal resistance; and an output part configured to output a signal according to a determination result of the micro short circuit determining part.

Further, in order to achieve the above-described object, a battery pack according to the present invention includes the battery condition detector described above and the rechargeable battery.

Further, in order to achieve the above-described object, a battery condition detecting method according to the present invention includes determining a micro short circuit of a rechargeable battery by detecting that the rechargeable battery has been charged for a capacity exceeding a chargeable capacity thereof during charging of the rechargeable battery.

Further, in order to achieve the above-described object, a battery condition detecting method according to the present invention includes determining a micro short circuit of a rechargeable battery by detecting a decrease in an internal resistance of the rechargeable battery from an initial value of the internal resistance.

Effects of the Invention

According to the present invention, it is possible to detect a micro short circuit of a rechargeable battery irrespective of a situation surrounding the rechargeable battery.

DESCRIPTION OF EMBODIMENTS

Figure 1:
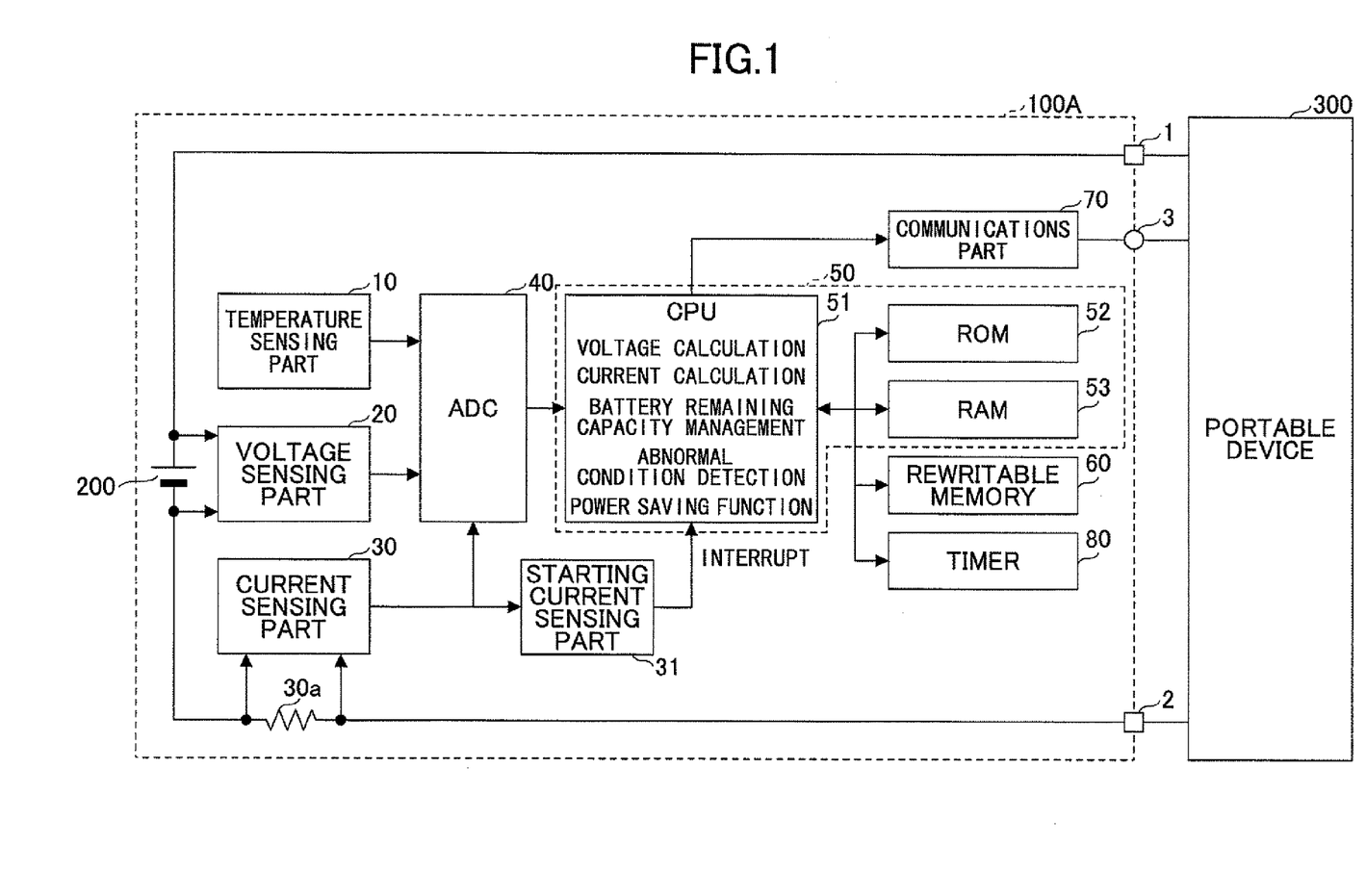
FIG. 1 is an overall configuration diagram of an intelligent battery pack 100A, which is an embodiment of a battery pack according to the present invention.

A description is given below, with reference to the drawings, of an embodiment for carrying out the invention. FIG. 1 is an overall configuration diagram of an intelligent battery pack 100A, which is an embodiment of a battery pack according to the present invention. The battery pack 100A includes, as a managing system that manages its battery condition, a battery condition detector including a temperature sensing part 10 configured to detect the ambient temperature of a rechargeable battery 200 such as a lithium ion battery, a nickel-metal hydride battery, or an electric double layer capacitor; a voltage sensing part 20 configured to detect the voltage of the rechargeable battery 200; a current sensing part 30 configured to detect the charging/discharge current of the rechargeable battery 200; an AD converter (hereinafter referred to as ADC) 40 configured to convert analog voltage values output from the respective sensing parts, indicating detection results, into digital values; a processing part 50 configured to perform operations such as current integration, capacity correction, and dischargeable capacity (for example, a microcomputer including a CPU 51, a ROM 52, and a RAM 53); a memory 60 containing characteristic data for identifying the characteristics of the components of the rechargeable battery 200 and the battery pack 100 used for the operations (for example, a storage device such as an EEPROM or a flash memory); a communications part 70 configured to transmit battery condition information on the rechargeable battery 200 to a portable device 300 using the rechargeable battery 200 as a power supply (for example, a communications IC); a timer 80 configured to manage time; and a starting current sensing part 31 configured to detect the starting current of the portable device 300 in accordance with the detection result of the current sensing part 30. Part or all of these components of the battery condition detector may be formed of an integrated circuit.

The battery pack 100A is a module component combining the rechargeable battery 200 and the managing system that manages its battery condition. The battery pack 100A is connected to the portable device 300 via electrode terminals (a positive electrode terminal 1 and a negative electrode terminal 2) and a communications terminal 3. The positive electrode terminal 1 is electrically connected to the positive electrode of the rechargeable battery 200 via a current-carrying path. The negative electrode terminal 2 is electrically connected to the negative electrode of the rechargeable battery 200 via a current-carrying path. The communications terminal 3 is connected to the communications part 70. The communications part 70 is an output part configured to output notification information based on the processing result of the processing part 50 to the portable device 300.

Examples of the portable device 300, which is an electronic device carriable by a man, include information terminal devices such as cellular phones, PDAs, and mobile personal computers; cameras; game apparatuses; and music or video players. The battery pack 100A is provided inside or attached externally to the portable device 300. The portable device 300, based on the battery condition information obtained from the communications part 70, performs a predetermined operation corresponding to the battery condition information. For example, the portable device 300 causes the battery condition information to be displayed (causes, for example, the remaining capacity information, the degradation information, and the replacement time information of the rechargeable battery 200 to be displayed) on a display part such as a display, and changes its own operating mode (for example, changes from a normal power consumption mode to a low power consumption mode) based on the battery condition information.

The rechargeable battery 200 is a power supply for the portable device 300 and is also a power supply for the ADC 40, the processing part 50, the communications part 70, and the timer 80. Further, the temperature sensing part 10, the voltage sensing part 20, the current sensing part 30, and the starting current sensing part 31 may require a supply of electric power from the rechargeable battery 200 depending on their circuit configurations. The memory 60 retains its stored information even after a supply of electric power from the rechargeable battery 200 is interrupted. The temperature sensing part 10, the voltage sensing part 20, the current sensing part 30, the ADC 40, and the processing part 50 operate as a condition detecting part configured to detect the battery condition of the rechargeable battery 200.

The temperature sensing part 10 is configured to detect the ambient temperature of the rechargeable battery 200 and output the detected ambient temperature after converting the detected ambient temperature into a voltage inputtable to the ADC 40. The battery temperature digital value indicating the ambient temperature of the rechargeable battery 200, obtained as a result of the conversion by the ADC 40, is transmitted to the processing part 50 and used as a parameter for operations. Further, the battery temperature digital value is converted into predetermined units by the processing part 50 and is output as battery condition information indicating the battery condition of the rechargeable battery 200 to the portable device 300 via the communications part 70. If the battery pack 100A is compactly built relative to the rechargeable battery 200, the temperature sensing part 10 may detect not only the temperature of the rechargeable battery 200 and its ambient temperature but also the temperatures of the battery pack 100A and its components. Further, in the case of forming the temperature sensing part 10, together with the voltage sensing part 20, the current sensing part 30, and the ADC 40, of an integrated circuit, the temperature sensing part 10 may detect the temperature of the integrated circuit and its ambient temperature.

The voltage sensing part 20 is configured to detect the voltage of the rechargeable battery 200 and output the detected voltage after converting the detected voltage into a voltage inputtable to the ADC 40. The battery voltage digital value indicating the voltage of the rechargeable battery 200, obtained as a result of the conversion by the ADC 40, is transmitted to the processing part 50 and used as a parameter for operations. Further, the battery voltage digital value is converted into predetermined units by the processing part 50 and is output as battery condition information indicating the battery condition of the rechargeable battery 200 to the portable device 300 via the communications part 70.

The current sensing part 30 is configured to detect the charging/discharge current of the rechargeable battery 200 and output the detected current after converting the detected current into a voltage inputtable to the ADC 40. The current sensing part 30 includes a current sensing resistor 30a connected in series to the rechargeable battery 200 and an operational amplifier configured to amplify a voltage generated across the current sensing resistor 30a. The current sensing part 30 converts the charging/discharge current into a voltage with the current sensing resistor 30a and the operational amplifier. The operational amplifier may be provided in the ADC 40. The battery current digital value indicating the charging/discharge current of the rechargeable battery 200, obtained as a result of the conversion by the ADC 40, is transmitted to the processing part 50 and used as a parameter for operations. Further, the battery current digital value is converted into predetermined units by the processing part 50 and is output as battery condition information indicating the battery condition of the rechargeable battery 200 to the portable device 300 via the communications part 70.

The processing part 50 is configured to calculate the remaining capacity of the rechargeable battery 200. Any appropriate method may be employed as the method of calculating the remaining capacity. An example of the calculating method is illustrated below.

The processing part 50 is capable of calculating the amount of electricity with which the rechargeable battery 200 is charged or which is discharged from the rechargeable battery 200 and of calculating a current amount of electricity stored in (the remaining capacity of) the rechargeable battery 200 by integrating a current value detected by the current sensing part 30 in the charging state or discharge state (state where electric current more than or equal to a predetermined value has been consumed by an operation of the portable device 300, for example) of the rechargeable battery 200. In calculating the remaining capacity, for example, Japanese Laid-Open Patent Application No. 2004-226393 discloses the idea that in the case where there is a change in a condition such as temperature or current in the charging/discharging of a rechargeable battery, the charging/discharging efficiency does not change, but a certain amount of electricity temporarily unavailable for charging or discharging is present in accordance with charging/discharging conditions and that amount changes. According to this idea, the charging/discharging efficiency may not be corrected.

However, if the components of the battery pack 100A include a temperature-dependent circuit part dependent on temperature, the processing part 50 may detect the ambient temperature with the temperature sensing part 10 and correct the charging/discharge current value of the rechargeable battery 200 subjected to the conversion by the ADC 40 based on a "charging/discharge current-temperature" characteristic. The "charging/discharge current-temperature" characteristic is represented by a correction table or a correction function. Data in the correction table or the coefficients of the correction function are stored as characteristic data in the memory 60. The processing part 50 corrects the charging/discharge current value according to the temperature measured by the temperature sensing part 10 in accordance with the correction table or correction function in which the characteristic data read from the memory 60 are reflected.

On the other hand, when the charging or discharging of the rechargeable battery 200 is stopped (for example, the operation of the portable device 300 enters a suspended or standby state), the charging/discharge current value becomes smaller than in the charging state or discharge state. As a result, if such a state continues for a certain period of time where the measurement with the current sensing part 30 and the ADC 40 includes many errors or is not performable for such reasons as resolution, the above-described errors of current integration are accumulated for calculation of the remaining capacity, so that the calculation of the remaining capacity loses accuracy. In order to prevent this, the processing part 50 may stop integrating current values or contain premeasured current consumption values of the portable device 300 in the memory 60 and integrate the values.

Figure 11:
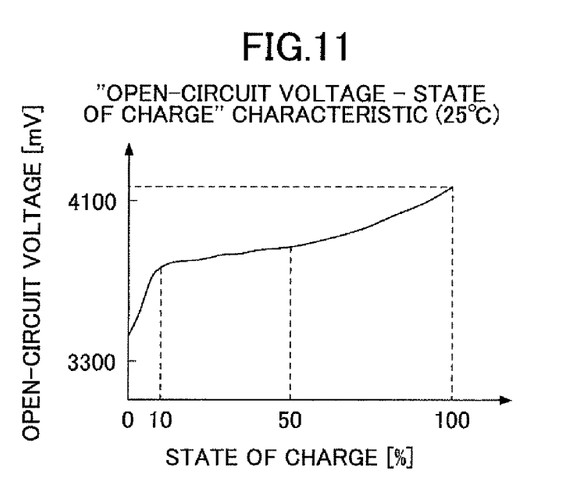
FIG. 11 is a graph illustrating an "open-circuit voltage-state of charge" characteristic at 25° C.

Further, in order to increase the computing accuracy of the remaining capacity, the state of charge, etc., the processing part 50 periodically measures the voltage (open-circuit voltage) of the rechargeable battery 200 and calculates and corrects the state of charge based on an "open-circuit voltage-state of charge" characteristic (see FIG. 11) if the portable device 300 continues to be stopped for a predetermined period of time. The open-circuit voltage is a voltage between the terminals of the rechargeable battery 200 in a stable state measured with the terminals being open or in a high impedance state. The state of charge refers to the ratio of the remaining capacity of the rechargeable battery 200, expressed in percentage, to the full-charge capacity of the rechargeable battery 200 at the time defined as 100. The "open-circuit voltage-state of charge" characteristic is represented by a correction table or a correction function. Data in the correction table or the coefficients of the correction function are stored as characteristic data in the memory 60. The processing part 50 corrects the state of charge corresponding to the open-circuit voltage measured by the voltage sensing part 20 in accordance with the correction table or correction function in which the characteristic data read from the memory 60 are reflected.

Further, if the open-circuit voltage of the rechargeable battery 200 has a temperature characteristic, the processing part 50 may perform a predetermined temperature correction on the open-circuit voltage. For example, the processing part 50 may detect the ambient temperature with the temperature sensing part 10 and correct the open-circuit voltage of the rechargeable battery 200 subjected to the conversion by the ADC 40 based on the "open-circuit voltage-temperature" characteristic. The "open-circuit voltage-temperature" characteristic is represented by a correction table or a correction function. Data in the correction table or the coefficients of the correction function are stored as characteristic data in the memory 60. The processing part 50 corrects the open-circuit voltage according to the temperature measured by the temperature sensing part 10 in accordance with the correction table or correction function in which the characteristic data read from the memory 60 are reflected.

As described above, the processing part 50 is capable of calculating the state of charge of the rechargeable battery 200. However, since the remaining capacity of the rechargeable battery 200 is calculable based on the relationship between the full-charge capacity and the state of charge, the remaining capacity of the rechargeable battery 200 is not calculable without the full-charge capacity of the rechargeable battery 200 being measured or estimated.

Methods of calculating the full-charge capacity of the rechargeable battery 200 include, for example, a method of calculating based on the discharged capacity of the rechargeable battery 200 and a method of calculating based on the charged capacity of the rechargeable battery 200. For example, in the case of calculating based on the charged capacity, compared with the case of calculating based on the discharged amount, which is susceptible to the current consumption characteristic of the portable device 300, it is possible to measure accurate charging current because the charging is performed at constant voltage or with constant current except for pulse charging. Needless to say, with respect to which method to use, both or one of them may be selected in consideration of the characteristics of the portable device 300, etc.

However, a condition under which an accurate full-charge capacity is measurable is the case of continuously performing charging for a period from a zero remaining capacity to a fully-charged state. The current values integrated during this charge period become a full-charge capacity. However, considering a common way of usage, such charging is rarely performed, and charging is usually started at a state where there is a certain remaining capacity.

Therefore, in consideration of such a case, the processing part 50 calculates the full-charge capacity of the rechargeable battery 200 based on a battery voltage immediately before the start of charging and a battery voltage at a time when a predetermined period of time has passed since the end of charging. That is, the processing part 50 calculates a state of charge immediately before the start of charging based on a battery voltage immediately before the start of charging and the "open-circuit voltage-state of charge" characteristic (see FIG. 11), and calculates a state of charge at a time when a predetermined period of time has passed since the end of charging based on a battery voltage at the time when the predetermined period of time has passed since the end of charging and the "open-circuit voltage-state of charge" characteristic (see FIG. 11). Then, letting the full-charge capacity be FCC [mAh], the state of charge immediately before the start of charging be SOC1 [%], the state of charge at the time when the predetermined period of time has passed since the end of charging be SOC2 [%], and the amount of electricity stored during a charge period between the start of charging and the end of charging be Q [mAh], the processing part 50 is capable of calculating the full-charge capacity FCC of the rechargeable battery 200 based on the operational expression:

$$FCC = Q/\{(SOC2-SOC1)/100\} \quad (1)$$

It is possible to calculate a more accurate value if SOC1 and SOC2 are subjected to temperature correction. Further, using a battery voltage at a time when a predetermined period of time has passed since the end of charging makes it possible to reflect a battery voltage stabler than at the end of charging in the operation, thereby making it possible to improve the accuracy of the operational result.

Therefore, it is possible to calculate the remaining capacity of the rechargeable battery 200 based on the state of charge and the full-charge capacity calculated as described above (the remaining capacity the full-charge capacity×the state of charge).

By the way, the occurrence of a micro short circuit or its progress in a rechargeable battery may cause problems such as reduction in dischargeable time and burning. Therefore, the battery condition detector of this embodiment is configured to detect the micro short circuit phenomenon of the rechargeable battery 200 and urge a user of the portable device 300 to replace the battery pack 100A, thereby preventing the occurrence of such problems. A detailed description is given below of this point.

Figure 8:
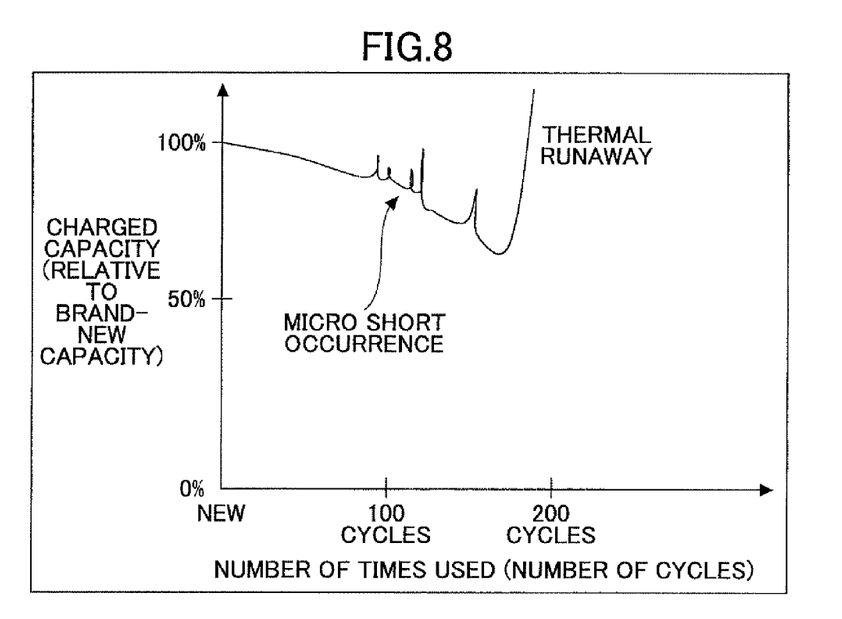
FIG. 8 illustrates data representing the relationship between the number of charging and discharging cycles and the capacity of a rechargeable battery charged before the stoppage of charging in each charging and discharging cycle.

The experiment of repeatedly charging and discharging a rechargeable battery has found that the occurrence of a micro short circuit causes the rechargeable battery to be charged beyond its full-charge capacity at the point. FIG. 8 illustrates data representing the relationship between the number of charging and discharging cycles and the capacity of a rechargeable battery charged before the stoppage of charging in each charging and discharging cycle. The charged capacity of the vertical axis represents the charged capacity of the rechargeable battery in percentage relative to the full-charge capacity of the rechargeable battery in a brand-new state defined as 100. The amount of electricity stored in the rechargeable battery at a point when the charging of the rechargeable battery is stopped corresponds to the full-charge capacity of the rechargeable battery at the point. As illustrated in FIG. 8, the amount of electricity storable in the rechargeable battery, which decreases because of a decrease in the full-charge capacity as the number of charging and discharging cycles increases, increases if a micro short circuit temporarily occurs. An instantaneous increase in the charged capacity in a charging and discharging cycle indicates a temporary occurrence of a micro short circuit in the charging and discharging cycle, and indicates a return to a normal state without a micro short circuit in the subsequent charging and discharging cycles.

Based on this point, according to this embodiment, the total value of the charged capacity charged during the charging of a rechargeable battery and the remaining capacity calculated at a calculation time immediately before the start of charging by a remaining capacity calculating part is compared with the full-charge capacity calculated at a calculation time before the start of charging (in particular, immediately before the start of previous charging in order to prevent an error in calculating the full-charge capacity) by a full-charge capacity calculating part, thereby determining the micro short circuit of the rechargeable battery. Then, if the total value exceeds the full-charge capacity, it is possible to determine the occurrence of a micro short circuit in the rechargeable battery.

Figure 2:
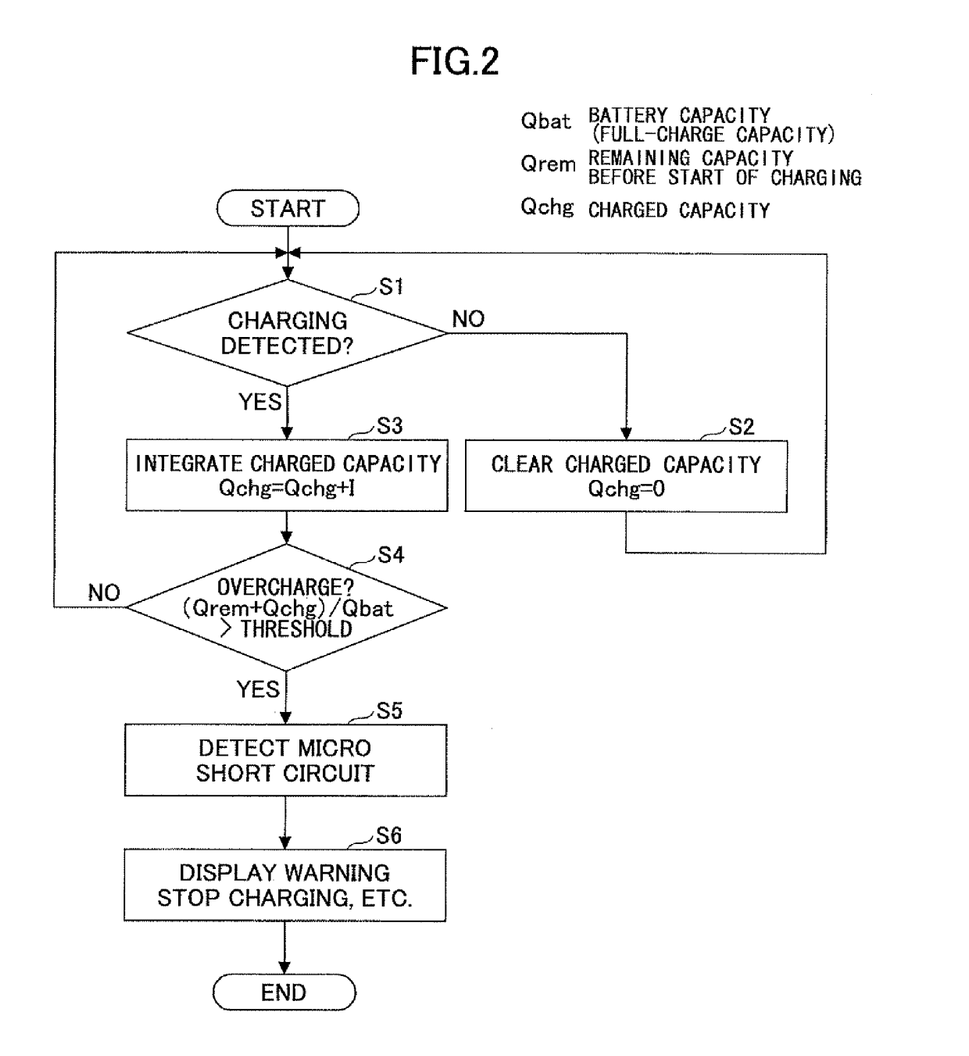
FIG. 2 is a flowchart of detecting a micro short circuit of a rechargeable battery based on a charged capacity.

FIG. 2 is a flowchart of detecting a micro short circuit of a rechargeable battery based on a charged capacity. In response to detection of the start of charging the rechargeable battery 200 by the current sensing part 30 detecting the direction of an electric current flowing through the rechargeable battery 200 (Step 1), the processing part 50 calculates a charged capacity Qchg by integrating charging current values I detected with the current sensing part 30 (Step 3). If no charging of the rechargeable battery 200 is detected in Step 1, the value of the charged capacity Qchg is made zero (Step 2).

The processing part 50 determines the occurrence of a micro short circuit in the rechargeable battery 200 if the charged capacity added during the charging of the rechargeable battery 200 exceeds a chargeable capacity of the rechargeable battery 200 so that the rechargeable battery 200 is overcharged. That is, letting the charged capacity added to the rechargeable battery 200 during its charging be Qchg, the remaining capacity calculated at a calculation time immediately before the start of the charging be Qrem, the full-charge capacity calculated at a calculation time immediately before the start of previous charging, which is a calculation time before the start of the charging, be Qbat, and a positive coefficient greater than or equal to one be K, if the relational expression represented by:

$$(Qrem+Qchg)/Qbat > K \quad (2)$$

holds (Step 4), the processing part 50 determines that there is a micro short circuit in the rechargeable battery 200 (Step 5). K may be equal to one. However, in consideration of a measurement or calculation error, K may be set to a positive number exceeding one (such as a value greater than or equal to 1.2 and smaller than or equal to 1.5) in order to avoid a wrong determination of a micro short circuit. If the relational expression (2) does not hold, it is possible to regard the rechargeable battery 200 as having no micro short circuit. Therefore, the processing part 50 returns to Step 1. The processing part 50 may determine that there is a micro short circuit in the rechargeable battery 200 when the charged capacity exceeds a chargeable capacity of the rechargeable battery 200 during its charging. Alternatively, however, the processing part 50 may also determine that there is a micro short circuit in the rechargeable battery 200 if the charged capacity charged between the start and the end (stop) of the charging of the rechargeable battery 200 exceeds a chargeable capacity of the rechargeable battery 200.

In Step 6, the communications part 70 transmits information on the occurrence of a micro short circuit of the rechargeable battery 200 determined in the processing part 50 to the portable device 300. Thereby, warning information based on the occurrence information is displayed on the display part of the portable device 300. Further, the warning information may be given audibly via an audio output part such as a loudspeaker of the portable device 300. Further, the processing part 50 may control a protection circuit so as to interrupt the charge path of the rechargeable battery 200 by outputting a signal for limiting the charging of the rechargeable battery 200. As a result, even if a micro short circuit occurs, it is possible to notify a user of its condition and to prevent the charging state from being continued.

Figure 9:
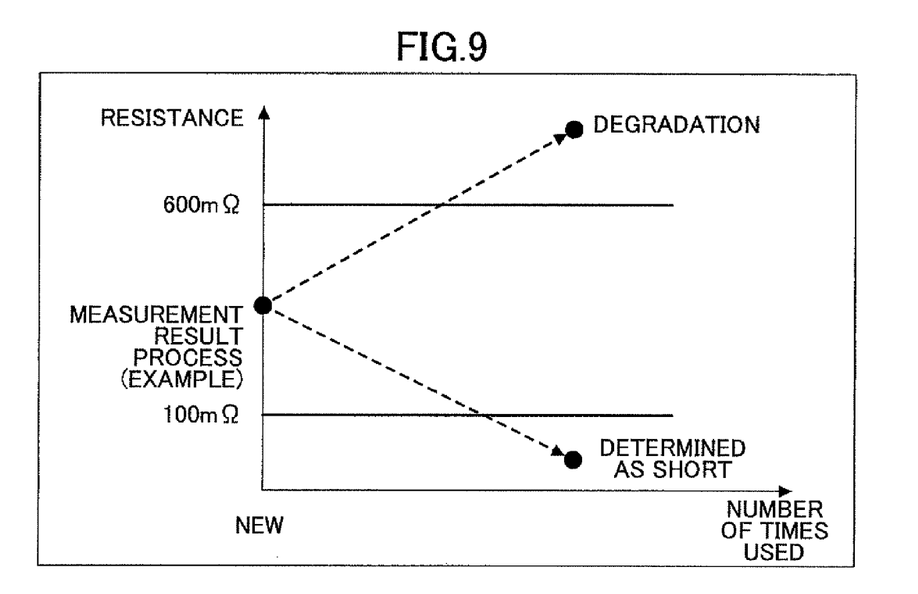
FIG. 9 illustrates data representing the relationship between the number of charging and discharging cycles and the internal resistance in each of the charging and discharging cycles.

By the way, if a micro short circuit occurs in a rechargeable battery, the phenomenon is observed as described above that charging is performed beyond the full-charge capacity at the time, while the phenomenon is also expected to be observed that the internal resistance is reduced. FIG. 9 illustrates data representing the relationship between the number of charging and discharging cycles and the internal resistance in each of the charging and discharging cycles. As illustrated in FIG. 9, the measurement of the internal resistance of a rechargeable battery increases as the number of charging and discharging cycles increases, but decreases in response to the occurrence of a micro short circuit.

Therefore, it is possible to determine the occurrence of a micro short circuit when a rechargeable battery that normally has presented the phenomenon of an increasing internal resistance due to degradation shows a continuous decreasing trend or a temporary decrease of the internal resistance.

According to this embodiment, the processing part 50 calculates the internal resistance of the rechargeable battery 200. Any appropriate method may be used for calculating the internal resistance, an example of which is illustrated below.

The processing part 50 calculates the internal resistance of the rechargeable battery 200 by detecting and calculating a current difference in charging/discharge current in a unit time including the start point of the charging of the rechargeable battery 200 and a voltage difference in battery voltage in the same period as the unit time.

That is, letting the battery voltage immediately before the start of charging be V0, the charging current immediately before the start of the charging be I0, the battery voltage at a time when a specified period of time has passed since the start of the charging be V1, and the charging current at the time when the specified period of time has passed since the start of the charging be I1, it is possible to calculate the internal resistance Rc of the rechargeable battery 200, assuming that the internal resistance immediately before the start of charging and the internal resistance at a time when a specified period of time has passed since the start of charging are equal, by an internal resistance computing equation:

$$Rc=(V1-V0)/(I1-I0) \quad (3)$$

In respect to this point, a description is omitted of the results of a confirmatory test conducted to confirm that stable calculation results are obtained of the internal resistance in the case of calculating the internal resistance by assigning the currents and voltages detected at points before and after the start of charging to the computing equation (3). According to the results of this confirmatory test, it is possible to calculate a stable internal resistance based on the differences in voltage and current between before and after the start of charging even with a difference in charging current due to progress in degradation compared with the "new" time.

Accordingly, when, after detecting, for a predetermined period of time, a stopped state where the value of the charging/discharge current of the rechargeable battery 200 is zero or a small charging/discharge current flows in the rechargeable battery 200, detecting a charging state in which flows a charging current of a value greater than or equal to a predetermined value, which is greater than a current value in the stopped state, the processing unit 50 may calculate the internal resistance of the rechargeable battery 200 in accordance with the above-described computing equation (3) based on the voltage value and the current value of the rechargeable battery 200 in the charging state at a time when a certain period of time has passed since the time of the detection of the charging current of a value greater than or equal to the predetermined value and on the voltage value and the current value of the rechargeable battery 200 in the stopped state before the time of the detection of the charging current of a value greater than or equal to the predetermined value. The processing part 50 may determine the micro short circuit of the rechargeable battery 200 by detecting a decrease in the calculated internal resistance from its initial value (prestored in the memory 60, etc.). The determination information is transmitted to the portable device 300 via the communications part 70.

Figure 3:
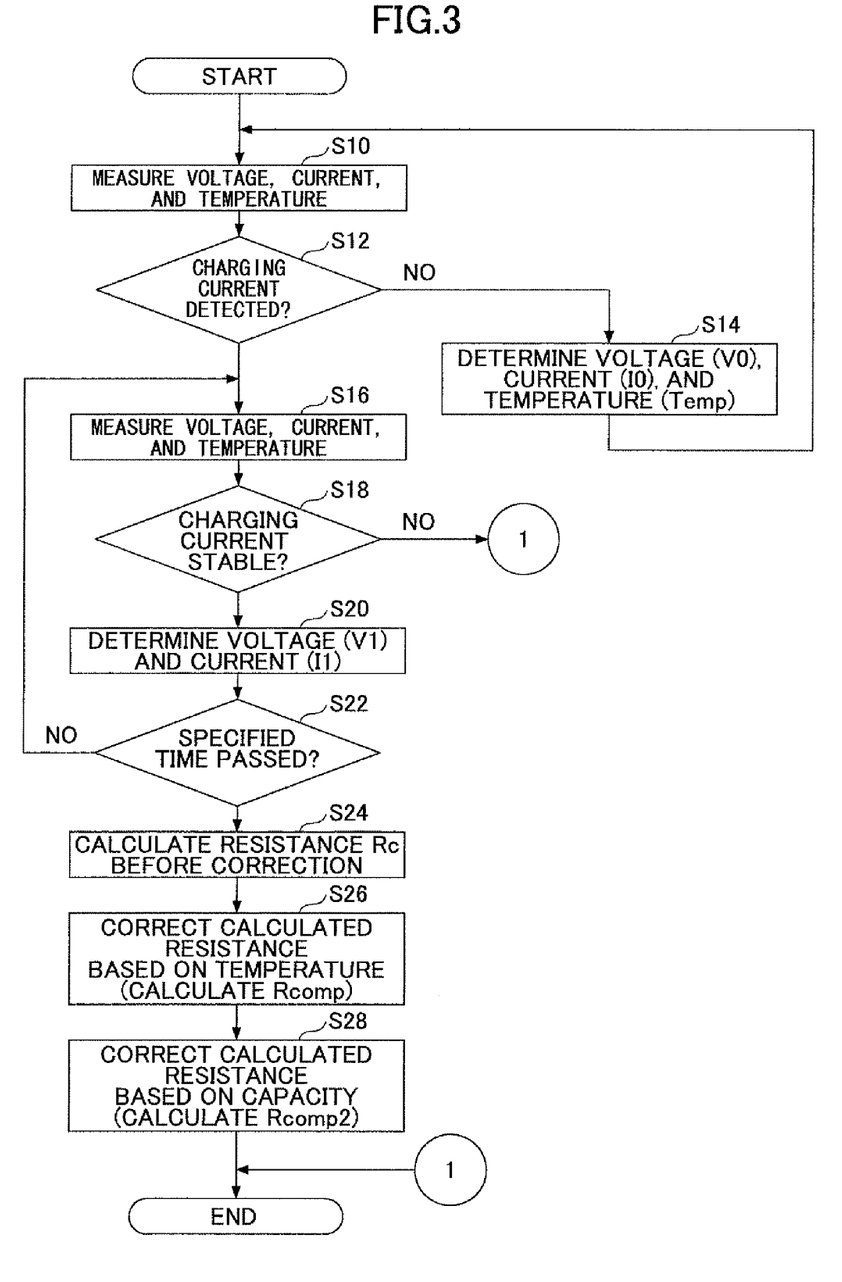
FIG. 3 is a flow of calculation of the internal resistance of a management system inside the battery pack 100A.

FIG. 3 is a flow of calculation of the internal resistance of a management system inside the battery pack 100A. The management system operates based on the processing unit 50. After the initialization of the management system, the processing part 50 measures a temperature with the temperature sensing part 10, measures a voltage with the voltage sensing part 20, and measures a current with the current sensing part 30 (Step 10). The processing part 50 detects the measurements given by these sensing parts at predetermined detection intervals, and stores the data of a voltage value, a current value, and a temperature value at the same point in a memory such as the RAM 53. This detection interval may be determined in consideration of the rising characteristic and the like of the charge-time battery voltage of the rechargeable battery 200 so as to make it possible to accurately detect a difference in voltage and a difference in current between before and after a rise of the battery voltage at the time of the charging of the rechargeable battery 200.

After detecting, with the current sensing part 30, a stopped state in which the charging/discharge current value is zero or a small charging/discharge current flows, the processing part 50 determines whether a current detected with the current sensing part 30 is greater than or equal to a predetermined positive first current threshold for determining the start of charging of the rechargeable battery 200 (Steps 10 and 12). If the current detected with the current sensing part 30 at the detection time of Step 10 is not greater than or equal to the first current threshold, the processing part 50 determines the detected voltage, current, and temperature as V0, I0, and Temp, respectively, as detection values immediately before the start of charging (Step 14). After the determination, the processing part 50 returns to Step 10. The V0, I0, and Temp are updated until the current detected with the current sensing part 30 is greater than or equal to the first current threshold in Step S12.

If the current detected in the current sensing part 30 in Step 10 is not greater than or equal to the first current threshold (absolute value) but is a discharge current of a value (absolute value) greater than or equal to a predetermined value, which is zero or greater than zero, the detected value may be regarded as not being suitable for calculating a correct internal resistance and be excluded from currents for calculating the internal resistance.

On the other hand, if the current detected with the current sensing part 30 at the detection time of Step 10 is greater than or equal to the first current threshold in Step 12, the processing part 50 regards it as the start of the charging of the rechargeable battery 200, and again measures a temperature with the temperature sensing part 10, measures a voltage with the voltage sensing part 20, and measures a current with the current sensing part 30 (Step 16). The processing part 50 determines whether the current detected with the current sensing part 30 in Step 16 is greater than or equal to a predetermined second current threshold greater than the first current threshold (Step 18). The second current threshold is a determination threshold for determining whether the charging state is a stable charging state after the rise of a charging current for the rechargeable battery 200 (a charging state where a variation in the charging current is smaller than in the rising state of the charging current).

If the current detected with the current sensing part 30 in Step 16 is not greater than or equal to the second current threshold, the processing part 50 determines that the charging current is still unstable after the start of charging and is not suitable for calculation of the internal resistance, and ends this flow. On the other hand, if the current detected with the current sensing part 30 in Step 16 is greater than or equal to the second current threshold, the processing part 50 determines that the charging current is stable and determines the detected voltage and current as V1 and I1, respectively, as detection values at a time when a specified period of time has passed since the start of charging (Step 20). Further, if a specified period of time has not passed since the detection of the current value greater than or equal to the first current threshold in Step 22, the processing part 50 determines that the charging current is still on the rise and returns to Step 16. On the other hand, if the specified period of time has passed, the processing part 50 proceeds to Step 24. In Step 24, the processing part 50 calculates the internal resistance Rc of the rechargeable battery 200 in accordance with the computing equation (3).

Figure 10:
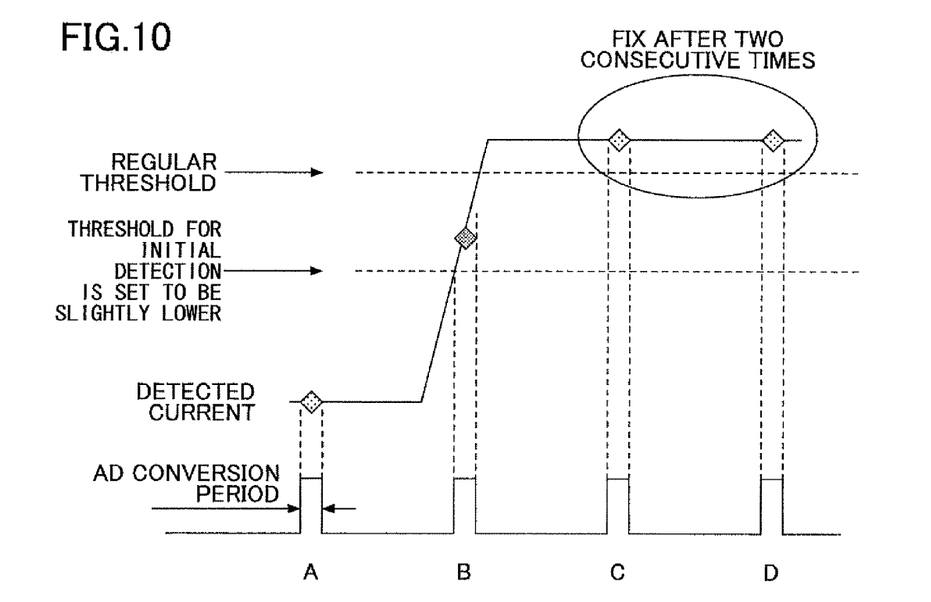
FIG. 10 illustrates a sequence of charging detection.

Accordingly, every time the rechargeable battery 200 is charged, the internal resistance Rc is calculated, and as illustrated in FIG. 10, by setting a first current threshold for determining the start of charging and a second current threshold greater than the first current threshold, it is possible to determine the point of starting charging the rechargeable battery 200 with certainty and to use values detected in a stable charging state for calculating the internal resistance.

Further, if the portable device 300 operates to intermittently consume electric current (for example, in the case of intermittently switching between a normal power consumption mode and a low power consumption mode or in the case where current consumption, which is 1 mA in a steady state, periodically becomes 100 mA), an overlap in timing between the rise of charging and detection of the current I0 before the start of charging or the current I1 after the start of charging results in an increase in error in calculating the internal resistance. However, it is possible to prevent error in calculating the internal resistance by calculating the internal resistance by setting two current thresholds as described above in consideration of the operating condition of the portable device 300. Further, in order to prevent error in calculating the internal resistance, for example, the average of detected values of multiple times, the average of those detected a number of times of detected values of multiple times, or a value detected n consecutive times may be adopted as a substitute value for the internal resistance computing equation in consideration of the operating condition of the portable device 300.

However, if the rechargeable battery 200 or a component of the battery pack 100A has a temperature characteristic, the internal resistance Rc has a temperature characteristic. For example, the open-circuit voltage of the rechargeable battery 200 tends to be reduced as its ambient temperature increases. Further, the temperature sensing part 10, the voltage sensing part 20, the current sensing part 30, and the ADC 40, which include analog elements such as a resistor, a transistor, and an amplifier, may be a temperature-dependent circuit part. Basically, an integrated circuit is designed in consideration of the temperature dependence of elements in the wafer at the stage of designing, but a manufactured IC has a temperature characteristic, although to a slight extent, because of the presence of a variation in the manufacturing process or variations in in-plane characteristics of the wafer.

Therefore, a correction operation is performed, using temperature information at the time of calculating the resistance, so that the calculated internal resistance remains the same no matter at which temperature the measurement is performed. The processing part 50 calculates a first corrected resistance Rcomp by correcting the resistance Rc calculated in Step 24 in accordance with the ambient temperature.

Any appropriate method may be used for correcting the internal resistance based on temperature. The "internal resistance-temperature characteristic" is represented by a correction table or a correction function. Data in the correction table or the coefficients of the correction function are stored as characteristic data in the memory 60. The processing part 50 is capable of calculating the first corrected resistance Rcomp, which is the corrected internal resistance Rc, according to a temperature at the time of measurement with the temperature sensing part 10 in accordance with the correction table or correction function in which the characteristic data read from the memory 60 are reflected.

Further, the calculated internal resistance also varies in accordance with the remaining capacity of the rechargeable battery 200. Therefore, a correction operation is performed so that a substantially constant internal resistance is calculated irrespective of a difference in the remaining capacity at the time of measurement. The processing part 50 calculates a second corrected resistance Rcomp2 by correcting the resistance Rcomp calculated in Step 26 in accordance with the remaining capacity (Step 28).

Any appropriate method may be used for correcting the internal resistance based on the remaining capacity. The "internal resistance-remaining capacity" characteristic is represented by a correction table or a correction function. Data in the correction table or the coefficients of the correction function are stored as characteristic data in the memory 60. The processing part 50 is capable of calculating the second corrected resistance Rcomp2, which is the first corrected resistance Rcomp corrected based on a remaining capacity Q0 immediately before the start of charging, in accordance with the correction table or correction function in which the characteristic data read from the memory 60 are reflected.

Next, determination of a micro short circuit is performed based on the internal resistance calculated with accuracy in FIG. 3. By way of example, FIGS. 4 through 7 are illustrated as flows for the determination of a micro short circuit. If a micro short circuit is determined, a user of the portable device 300 may be notified and the charging of the rechargeable battery 200 may be limited the same as described above.

Figure 4:
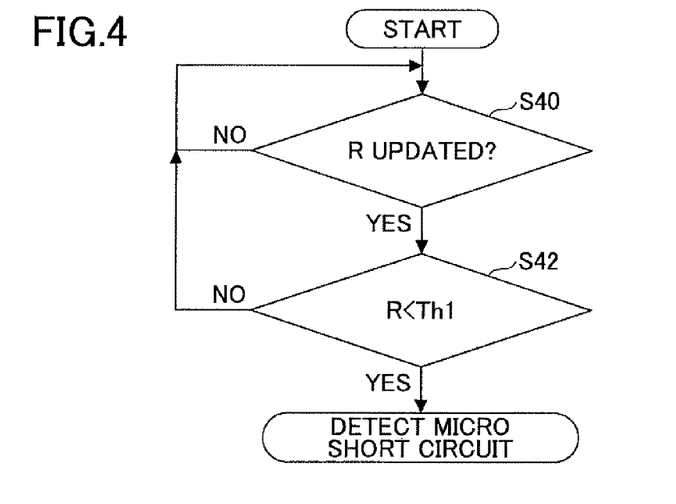
FIG. 4 is a first flow of determination of a micro short circuit.

In FIG. 4, if the computed value of an internal resistance R is updated (Step 40), the processing part 50 determines a micro short circuit if the computed value is less than a predetermined threshold Th1 (for example, 100 mΩ) (Step 42).

Figure 5:
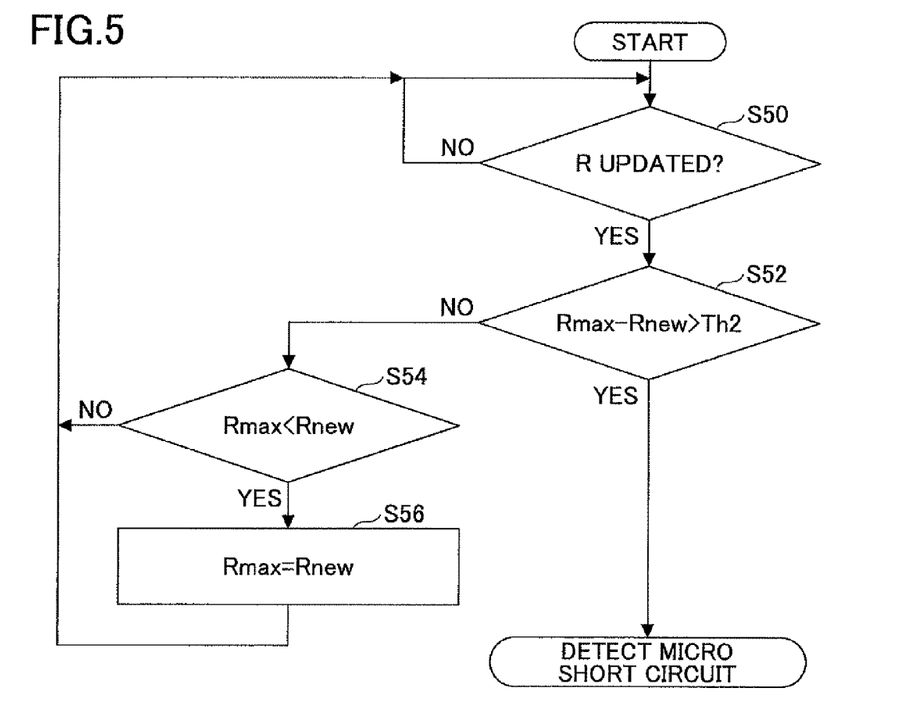
FIG. 5 is a second flow of determination of a micro short circuit.

In FIG. 5, if the computed value of an internal resistance R is updated (Step 50), the processing part 50 determines a micro short circuit if a difference obtained by subtracting a current internal resistance Rnew computed in Step 50 from an internal resistance Rmax (stored in the memory 60) showing the highest measurement between the computing step of the last time and the computing step of a predetermined number of times before is greater than a predetermined threshold Th2 (Step 52). In the case where the difference is not greater than the threshold Th2 in Step 52, if the largest past internal resistance Rmax is smaller than the current internal resistance Rnew (Step 54), the processing part 50 replaces the internal resistance Rmax with the value of the current internal resistance Rnew (Step 56).

Figure 6:
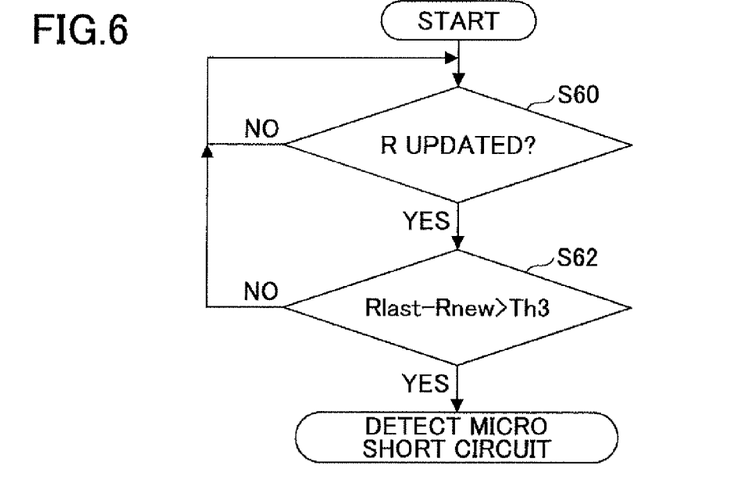
FIG. 6 is a third flow of determination of a micro short circuit.

In FIG. 6, if the computed value of an internal resistance R is updated (Step 60), the processing part 50 determines a micro short circuit if a difference obtained by subtracting a current internal resistance Rnew computed in the computing step of Step 60 of this time from an internal resistance Rlast in the computing step of the last time is greater than a predetermined threshold Th3 (Step 62).

Figure 7:
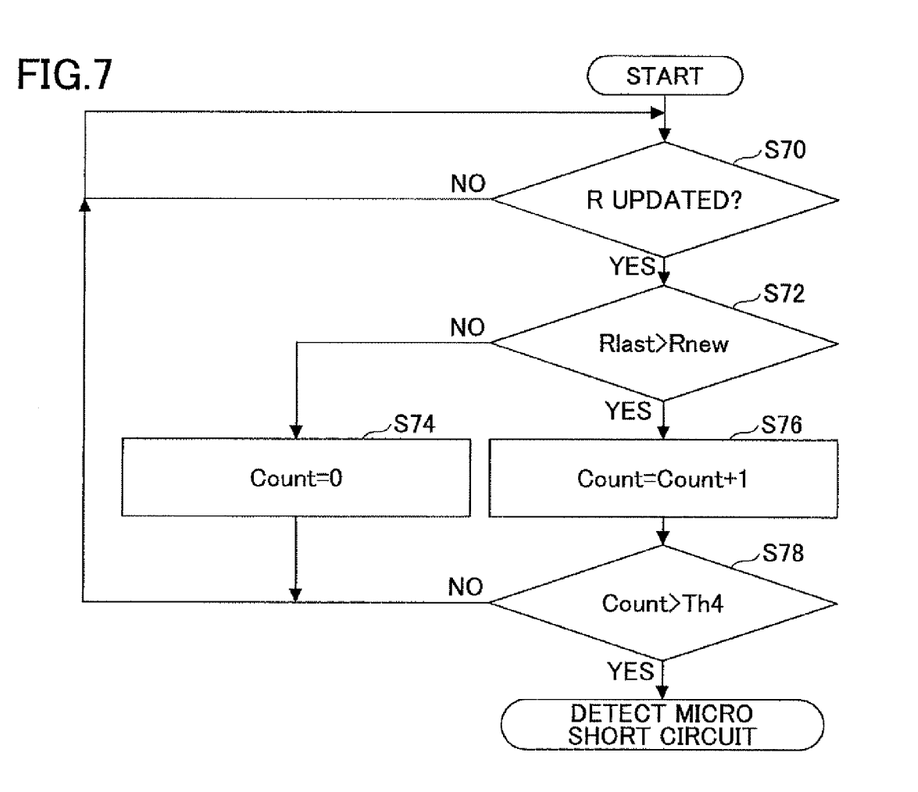
FIG. 7 is a fourth flow of determination of a micro short circuit.

In FIG. 7, if the computed value of an internal resistance R is updated (Step 70), the processing part 50 determines a micro short circuit if detecting a decrease in the internal resistance for a specified number of consecutive times. That is, if the last internal resistance Rlast is not greater than a current internal resistance Rnew, the processing part 50 clears the count value Count of a counter (Step 74), and if the last internal resistance Rlast is greater than the current internal resistance Rnew, the processing part 50 increments the count value Count (Step 76). If the count value Count is greater than a predetermined threshold Th4 (Step 78), the processing part 50 determines a micro short circuit.

Here, the thresholds for the determination of a micro short circuit, such as Th1, may be stored in the memory 60. By rewriting a threshold for the determination of a micro short circuit stored in the memory 60, it is possible to easily change the threshold for the determination of a micro short circuit on the basis of the specifications of the portable device 300 or the rechargeable battery 200. That is, it is possible to properly determine a micro short circuit even if there is a change in the specifications of the portable device 300 to which the battery pack 100A is attached or the specifications of the rechargeable battery 200 housed in the battery pack 100A.

Further, in determining a micro short circuit, the processing part 50 may determine the micro short circuit of the rechargeable battery 200 using the initial internal resistance calculated based on a detected value before the start of feeding the rechargeable battery 200 with electricity as a determination reference value for the determination of a micro short circuit. The processing part 50 determines the micro short circuit state of the rechargeable battery 200 based on a comparison between the initial internal resistance and the internal resistance calculated based on a detected value after the start of feeding the rechargeable battery 200 with electricity. For example, the processing part 50 determines progress in the micro short circuit of the rechargeable battery 200 if detecting that a difference obtained by subtracting the internal resistance after the start of feeding electricity from the initial internal resistance before the start of feeding electricity is greater than or equal to a predetermined value.

Further, the initial internal resistance may be calculated based on voltage and current values detected before and after the start of initial charging of the rechargeable battery 200 before attachment of the battery pack 100A to the portable device 300 (for example, before the shipment of the battery pack 100A). In the case of automatically detecting the initial charging operation with the current sensing part 30 or the like, the processing part 50 calculates the initial internal resistance based on the detected values before and after the start of the initial charging, and stores the calculation result in the memory 60 as a determination reference value for determining degradation. The initial charging may be performed by, for example, feeding a pulse charging current through the electrode terminals of the battery pack 100A from outside the battery pack 100A.

Therefore, according to the above-described embodiment, since a circuit configured to detect current and voltage and a circuit configured to calculate a charged capacity and an internal resistance are provided inside the battery pack 100A, not only is it unnecessary to provide a dedicated measuring unit for detecting a micro short circuit as an external apparatus or a built-in device of the portable device 300, but also it is possible to determine a micro short circuit even during a storage period before and after the shipment of the battery pack 100A or during usage of the portable device 300 by a general user, thus making it possible to determine a micro short circuit that has occurred before the shipment or a micro short circuit that occurs or grows after the shipment.

In general, a rechargeable battery is attached to the body of a device that uses the rechargeable battery for the first time when a user purchases a product. Therefore, it is possible that a micro short circuit has occurred in the previous state of storage. According to this technique, since a circuit configured to detect a micro short circuit is provided inside a battery pack, it is possible to execute the operation of detecting a micro short circuit using a built-in rechargeable battery as a power supply even if the battery pack is in the state of storage. Further, by attaching the battery to the device body at a shop, the battery information of the rechargeable battery is obtained on the portable device side. This allows a screen to urge replacement of the rechargeable battery to be displayed on the display of the portable device, thus making it possible to identify a poor battery before it is passed on to a user.

Further, according to a method that simply determines the occurrence of a certain kind of abnormality and performs a protecting operation in response to a continuation of abnormal charging for a certain period of time, there is a risk of an overcharge depending on elapsed time. However, no such problem of an overcharge occurs according to this embodiment that takes a remaining capacity at the start of charging into consideration.

Further, by reporting the detection of an abnormality such as a micro short circuit to the portable device using the battery pack, it is possible to urge a user to replace the battery on the portable device side and to collect the battery before the occurrence of a problem such as burning.

Further, a resistance change at the time of degradation is more conspicuous in the above-described internal resistance calculated based on values detected before and after the start of charging than in impedance measured based on alternating current. Therefore, it is possible to control the effect of an error in resistance calculation on the determination of degradation that makes a comparison with a determination threshold.

Further, since the battery condition is monitored from the initial state, it is possible to detect a degradation abnormality such as a micro short circuit in the battery by, for example, detecting a switch of the internal resistance from an increasing trend to a decreasing trend and to notify the portable device 300 or its user of the degradation abnormality.

A description is given in detail above of a preferred embodiment of the present invention. However, the present invention is not limited to the above-described embodiment, and variations and replacements may be added to the above-described embodiments without departing from the scope of the present invention.

For example, based on the same way of thinking, a portable device whose starting current and discharge current are substantially constant even for a short period of time may produce the same effects even if the above-described operation of calculating an internal resistance based on values detected before and after the start of charging is replaced with the operation of calculating an internal resistance based on values detected before and after the start of discharging. Further, a voltage drop is caused by suspending charging for a certain period of time while performing charging with constant current. Therefore, based on the same way of thinking, the same effects are also produced by replacing the above-described start of discharging with the voltage drop. Further, a voltage rise is caused by suspending charging and resuming charging after passage of a certain period of time. Therefore, based on the same way of thinking, the same effects are also produced by replacing the above-described start of charging with the voltage rise.

Further, by changing, in accordance with values stored in the memory 60, the timing of detecting the voltage and current after the start of charging used for calculating the internal resistance, it is possible to detect the voltage and current after the start of charging with best detection timing according to the kind of the rechargeable battery.

The present international application is based on and claims the benefit of priority of Japanese Patent Application No. 2008-233728, filed on Sep. 11, 2008, the entire contents of which are incorporated herein by reference.

DESCRIPTION OF THE REFERENCE NUMERALS

10 temperature sensing part
20 voltage sensing part
30 current sensing part
31 starting current sensing part
40 ADC
50 processing part
60 memory
70 communications part
80 timer
100A battery pack
200 rechargeable battery
300 portable device

The invention claimed is:

1. A battery condition detector, comprising:
a processor; and
a memory storing instructions that, when executed by the processor, cause the battery condition detector to
calculate an internal resistance of a rechargeable battery;
determine a micro short circuit of the rechargeable battery by detecting a decrease in the calculated internal resistance from an initial value of the internal resistance; and
output a signal according to a result of determining the micro short circuit.

2. The battery condition detector as claimed in claim 1, wherein the memory stores instructions that, when executed by the processor, cause the battery condition detector to determine the micro short circuit of the rechargeable battery by detecting the decrease in the calculated internal resistance from the initial value of the internal resistance based on the internal resistance calculated every time the rechargeable battery is charged.

3. The battery condition detector as claimed in claim 1, wherein the memory stores instructions that, when executed by the processor, cause the battery condition detector to determine the micro short circuit of the rechargeable battery by detecting a difference exceeding a predetermined determination value, the difference being obtained by subtracting the internal resistance calculated in a current charging cycle from the internal resistance calculated in a previous charging cycle or a charging cycle therebefore.

4. The battery condition detector as claimed in claim 1, wherein the memory stores instructions that, when executed by the processor, cause the battery condition detector to calculate the internal resistance of the rechargeable battery based on a difference in voltage and a difference in current between before and after a start of charging of the rechargeable battery.

5. The battery condition detector as claimed in claim 4, wherein the memory stores instructions that, when executed by the processor, cause the battery condition detector to calculate the internal resistance based on:
the difference in voltage between a first voltage detected at a detection time before detection of a value of a charging current of the rechargeable battery greater than or equal to a predetermined value and a second voltage detected at a detection time after the detection of the value of the charging current greater than or equal to the predetermined value; and
the difference in current between a first current detected at the detection time before the detection of the value of the charging current of the rechargeable battery greater than or equal to the predetermined value and a second current detected at the detection time after the detection of the value of the charging current greater than or equal to the predetermined value.

6. The battery condition detector as claimed in claim 1, wherein the memory stores instructions that, when executed by the processor, cause the battery condition detector to output a signal for reporting an abnormality of the rechargeable battery.

7. The battery condition detector as claimed in claim 1, wherein the memory stores instructions that, when executed by the processor, cause the battery condition detector to output a signal for limiting charging of the rechargeable battery.

8. A battery pack, comprising:
the battery condition detector as set forth in claim 1; and
the rechargeable battery.

9. A battery condition detecting method, comprising:
calculating an internal resistance of a rechargeable battery;
determining a micro short circuit of the rechargeable battery by detecting a decrease in the calculated internal resistance of the rechargeable battery from an initial value of the internal resistance; and
outputting a signal according to a result of determining the micro short circuit.

* * * * *